(12) United States Patent
Choi

(10) Patent No.: US 7,081,878 B2
(45) Date of Patent: Jul. 25, 2006

(54) APPARATUS AND METHOD FOR CONTROLLING PHASE OF SAMPLING CLOCK SIGNAL IN LCD SYSTEM

(75) Inventor: Dong-Hoon Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 428 days.

(21) Appl. No.: 10/142,959

(22) Filed: May 13, 2002

(65) Prior Publication Data
US 2003/0011580 A1   Jan. 16, 2003

(30) Foreign Application Priority Data
Jul. 13, 2001 (KR) .............................. 2001-42352

(51) Int. Cl.
G09G 3/36 (2006.01)
(52) U.S. Cl. .................. 345/99; 345/204; 345/98; 348/537
(58) Field of Classification Search .............. 345/213, 345/3.1, 87–103, 204–205, 208–210, 211; 348/572, 607, 536–537, 790–792
See application file for complete search history.

(56) References Cited

U.S. PATENT DOCUMENTS

| 6,097,444 A * | 8/2000 | Nakano ...................... 348/607 |
| 6,268,848 B1 * | 7/2001 | Eglit .......................... 345/213 |
| 6,285,344 B1 * | 9/2001 | Everard et al. .............. 345/3.1 |
| 6,340,993 B1 * | 1/2002 | Hasegawa et al. .......... 348/572 |
| 6,724,381 B1 * | 4/2004 | Sakashita .................... 345/213 |

* cited by examiner

Primary Examiner—Lun-yi Lao
(74) Attorney, Agent, or Firm—Robert E. Bushnell, Esq.

(57) ABSTRACT

An apparatus and a method for accurately controlling the phase of a sampling clock signal in an LCD system, wherein the sampling clock is generated by a phase lock loop and delayed in response to a phase delay quantity generated by a controller. The controller continuously generates a first phase delay quantity until a horizontal line width of a digital image signal is equal to a desired width, stores a first total phase delay quantity corresponding to how many times the first phase delay quantity was generated, continuously generates a second phase delay quantity until the current horizontal line width is greater than the desired width, stores a second total phase delay quantity corresponding to how many times the second phase delay quantity was generated, and controls the phase delay of the sampling clock in response to an optimum phase delay quantity which is an average of the first and second phase delay quantities.

21 Claims, 3 Drawing Sheets

FIG. 1 *(Related Art)*
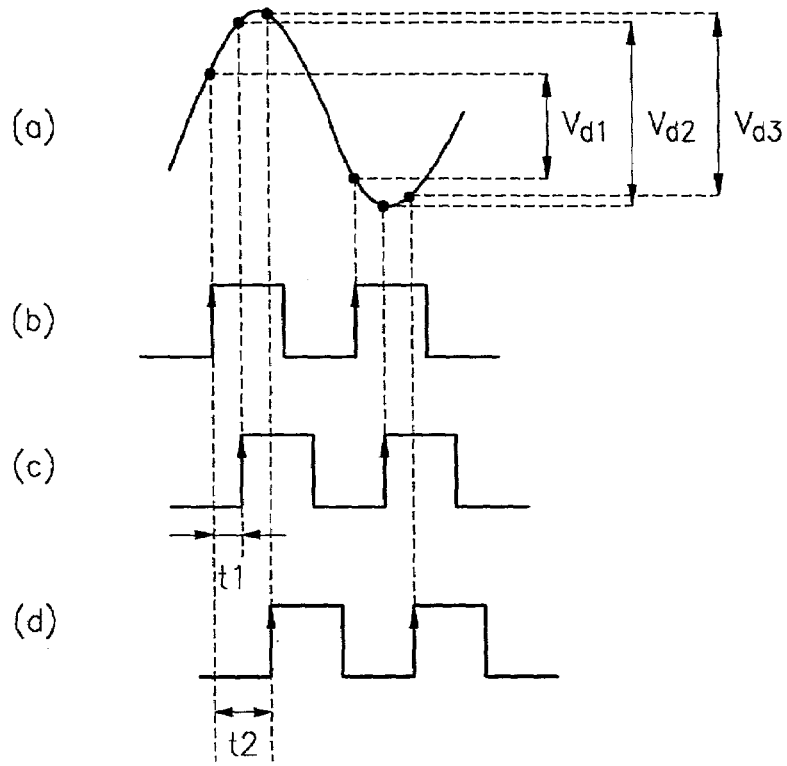
FIG. 2
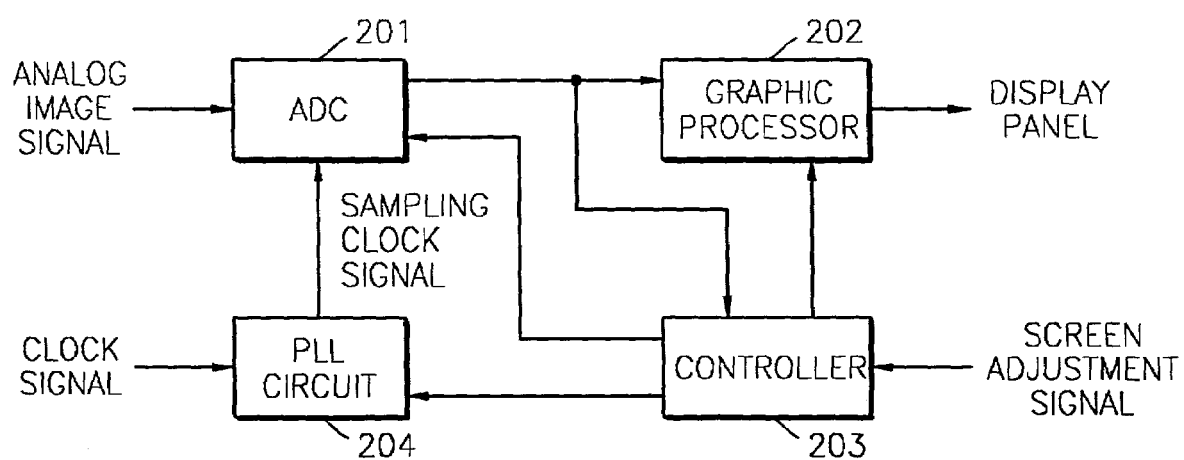

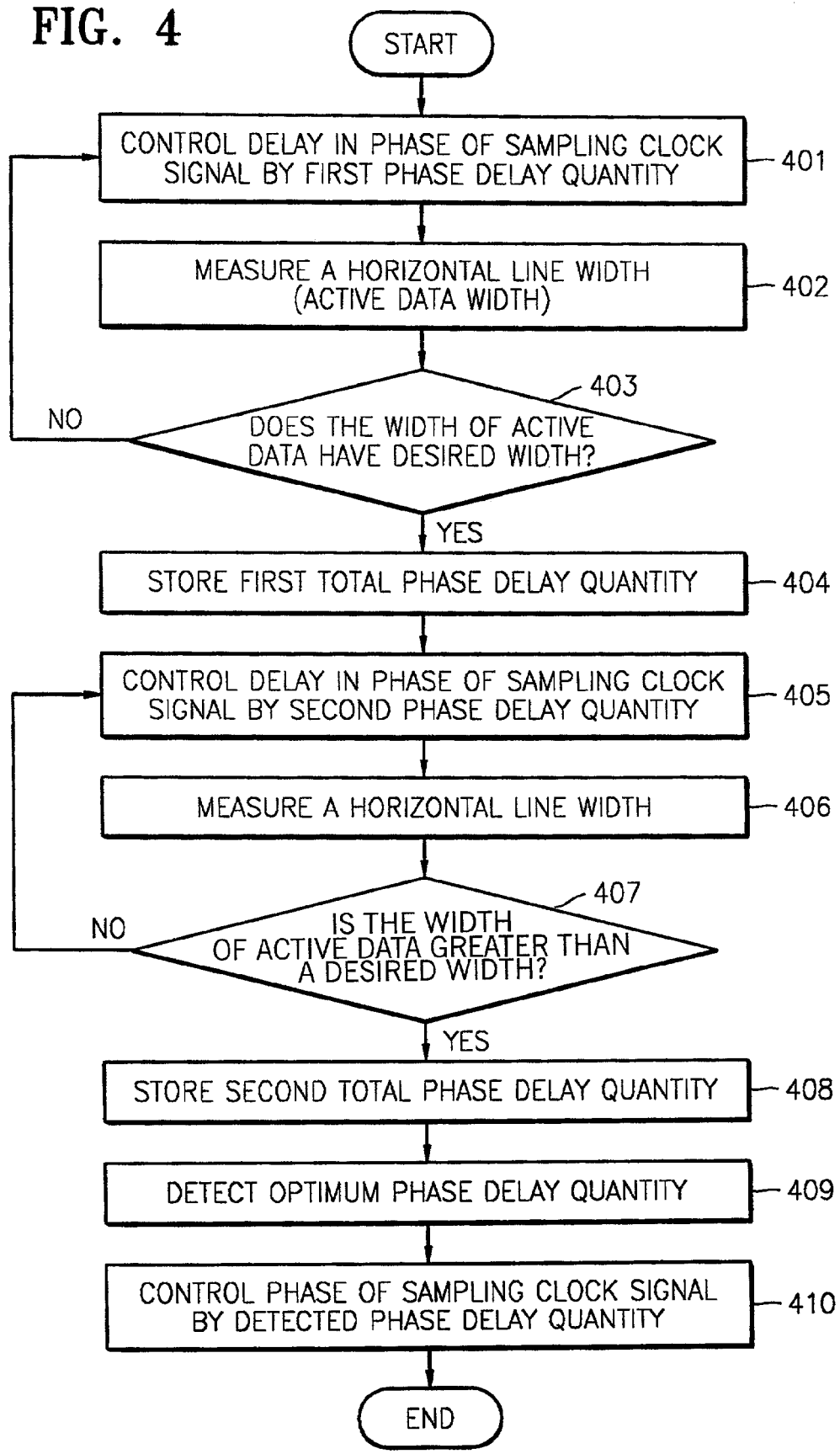

APPARATUS AND METHOD FOR CONTROLLING PHASE OF SAMPLING CLOCK SIGNAL IN LCD SYSTEM

CLAIM OF PRIORITY

This application makes reference to, incorporates the same herein, and claims all benefits accruing under 35 U.S.C. § 119 from my application APPARATUS FOR CONTROLLING PHASE OF SAMPLING CLOCK IN THE LCD SYSTEM AND METHOD THEREOF with the Korean Intellectual Property Office on Jul. 13, 2001 and there duly assigned Serial No. 42352/2001.

BACKGROUND OF THE INVENTION

1. Field of the Invention

The present invention relates to an apparatus and a method for controlling the phase of a sampling clock signal in a liquid crystal display (hereinafter, referred to as LCD) system, and more particularly, to an apparatus and a method for controlling the phase of a sampling clock signal to accurately adjust the state of a screen.

2. Description of the Related Art

An LCD system is a kind of flat panel display. Such LCD systems have a function of converting a received analog image signal into a digital image signal before the image is scaled to a displayable format so that the LCD systems can be applied to an analog image processing environment.

However, the quality of a screen is deteriorated if the phase of a sampling clock signal used for converting the analog image signal to the digital image signal is out of phase with the received analog image signal. Thus, whenever the received analog signal is changed, the phase of the sampling clock signal must be adjusted so that the phase of the sampling clock signal corresponds with the phase of the received analog image signal.

To do this, it has been proposed that LCD systems detect level difference values between image signals, which are sampled by delaying the phase of the sampling clock signal several times, and then detects an optimum phase point for the sampling clock signal utilizing the detected level difference values. Also, the sampling clock signal having the optimum phase point is used for converting the analog image signal to the digital image signal.

A method for controlling the phase of the sampling clock signal in the proposed LCD system will be described in more detail with reference to FIG. 1. When an analog image signal is applied as shown in (a) of FIG. 1, two points of the analog image signal are sampled utilizing a sampling clock signal having a phase shown in (b) of FIG. 1. Next, a level difference value $Vd_1$ between the two points of the analog image signal is detected. As shown in (c) of FIG. 1, two points of an analog image signal input are sampled utilizing a sampling clock signal having a phase which is delayed by $t_1$. Next, a level difference value $Vd_2$ between the two points of the analog image signal is detected. As shown in (d) of FIG. 1, two points of an analog image signal input are sampled utilizing a sampling clock signal having a phase which is delayed by $t_2$. Next, a level difference value $Vd_3$ between the two points of the analog image signal is detected.

The detected level difference values $Vd_1$, $Vd_2$, and $Vd_3$ are compared with each other to detect the maximum level difference value. The phase of a sampling clock signal is controlled in a way that the sampling clock signal, which is used for detecting the maximum level difference value, is used for converting an analog image signal to a digital image signal. The sampling clock signal used for detecting the maximum level difference value is determined to be a sampling clock signal having an optimum phase, since the sampling clock signal is regarded as detecting a peak point of an input image signal.

A level difference between two points of an input image signal is the maximum value, i.e., a peak point of the image signal, as described above. However, in reality, the two points of the sampled image signal may only be adjacent to the peak point of the sampled image signal. If the two points of the sampled image signal are adjacent to the peak point instead of at the peak point, a screen may not be accurately adjusted using the sampling clock signal.

SUMMARY OF THE INVENTION

To solve the above-described problems, it is an object of the present invention to provide an apparatus and a method for accurately controlling the phase of a sampling clock signal in an LCD system using the result of measuring the width of active data of an input image signal after delaying the sampling clock signal.

Accordingly, to achieve the above object, there is provided an apparatus for controlling the phase of a sampling clock signal used for sampling a received image signal. The apparatus includes a clock signal generation circuit for generating a sampling clock signal which has a phase that is delayed by a supplied phase delay quantity and is used as the sampling clock signal of the image signal, and a controller for controlling a phase delay quantity of the sampling clock signal by a middle value of a first total phase delay quantity supplied until the active data of the received image signal has a desired width after a first phase delay quantity is supplied to the clock signal generation circuit and a second total phase delay quantity supplied until the active data of the received image signal is greater than a desired width after a second phase delay quantity is supplied to the clock signal generation circuit. The first total phase delay quantity is a multiple of the first phase delay quantity, and the second total phase delay quantity is a multiple of the second phase delay quantity.

To achieve the above object, there is provided an apparatus for controlling the phase of a sampling clock signal in a liquid crystal display (LCD) system having an analog-to-digital converter (ADC) for converting an analog image signal input to a digital image signal and a graphic processor for scaling the digital image signal output from the ADC to a displayable format. The apparatus includes a clock signal generation circuit for outputting a sampling clock signal, a phase of which is delayed by a phase delay quantity applied, to the ADC, and a controller for controlling a phase delay quantity of the sampling clock signal by a middle value of a first total phase delay quantity supplied until the active data of the image signal output from the ADC has a desired width after a first phase delay quantity is supplied to the clock signal generation circuit and a second total phase delay quantity supplied until the active data of the image signal output from the ADC is greater than a desired width after a second phase delay quantity is supplied to the clock signal generation circuit.

To achieve the above object, there is provided a method for controlling the phase of a sampling clock signal for a received image signal. It is measured whether or not the width of active data of an image signal sampled by a first sampling clock signal, a phase of which is delayed by a first phase delay quantity, has a desired width. The first phase delay quantity is stored if the width of active data has the desired width. It is measured whether or not the width of active data of an image signal sampled by a second sampling clock signal, a phase of which is delayed by a second phase delay quantity, is greater than a desired width. The second current phase delay quantity is stored if the width of active data is greater than the desired width. A phase delay of the sampling clock signal is controlled by a middle value of the first phase delay quantity and the second phase delay quantity.

To achieve the above object, there is provided a method of controlling the phase of a sampling clock signal in an LCD system having a ADC for converting an analog image signal input to a digital image signal and a graphic processor for scaling the digital image signal output from the ADC to a displayable format. It is measured whether or not the width of active data of the digital image signal output from the ADC has a desired width after a first sampling clock signal, a phase of which is delayed by a first phase delay quantity, is supplied to the ADC. A first total phase delay quantity of the first sampling clock signal is stored if the width of active data has the desired width. It is measured whether or not the width of active data of the digital image signal output from the ADC is greater than the desired width after a second sampling clock signal, a phase of which is delayed by a second phase delay quantity, is supplied to the ADC. A second total phase delay quantity of the second sampling clock signal is stored if the width of active data is greater than the desired width. A delay phase of the sampling clock signal supplied to the ADC is controlled by a middle value of the first total phase delay quantity and the second total phase delay quantity.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIG. 1 is a timing diagram for explaining a method for controlling the phase of a sampling clock signal in an exemplary LCD system;

FIG. 2 is a block diagram showing a function of an LCD system having an apparatus for controlling the phase of a sampling clock signal according to the present invention;

FIG. 4 is flowchart showing a method of controlling the phase of a sampling clock signal in the LCD system according to the present invention.

DETAILED DESCRIPTION OF THE EMBODIMENT

Hereinafter, an embodiment of the present invention will be described in detail with reference to the attached drawings.

FIG. 2 is a block diagram showing a function of an LCD system having an apparatus for controlling the phase of a sampling clock signal according to the present invention. Referring to FIG. 2, the LCD system includes an analog-to-digital converter (ADC) 201, a graphic processor 202, a controller 203, and a phase-locked loop (PLL) circuit 204.

The ADC 201 samples an analog image signal input in synchronization with a sampling clock signal output from the PLL circuit 204 and outputs the analog image signal as a digital image signal. A sampling process for converting the analog image signal to the digital image signal is performed as described previously.

The graphic processor 202 scales the digital image signal transmitted from the ADC 201 to a displayable format and then transmits the digital image signal having a displayable format to a display panel (not shown). The scaling in the graphic processor 202 is performed by an existing well-known method.

The controller 203 supplies a predetermined first phase delay quantity to the PLL circuit 204 if the controller 203 receives a screen adjustment signal, or recognizes the need for internal adjustment of the screen during the operational control of the LCD system.

The width of active data of an input image signal is measured based on the digital image signal output from the ADC 201. The active data represents image signals that are converted into digital signals in the ADC 201 among received analog signals. Thus, the width of the active data is a section in which digital image signals corresponding to the received analog image signals are output from the ADC 201. Accordingly, the width of active data is the width corresponding to a horizontal line of the image signal. It is measured whether or not active data of a digital image signal output from the ADC 201 has a desired (or horizontal line) width.

The width of active data is measured by supplying the first phase delay quantity to the PLL circuit 204, recognizing first data on a horizontal line as being output from the ADC 201, and detecting an end point of active data of an image signal output from ADC 201 based on the number of cycles of the sampling clock signals generated for the horizontal line. For example, if the number of cycles of the sampling clock signals generated for the horizontal line is determined to be 1024, by internally counting 1024, the controller 203 recognizes the output of the first data, and then detects the end point of the active data from data output from the ADC 201.

As the result of the detected end point of active data, if the active data of the digital image signal output from the ADC 201 does not have a desired width which is the width of a horizontal line, the controller 203 continuously supplies the first phase delay quantity to the PLL circuit 204 until the active data has the desired width.

Figure 3A:
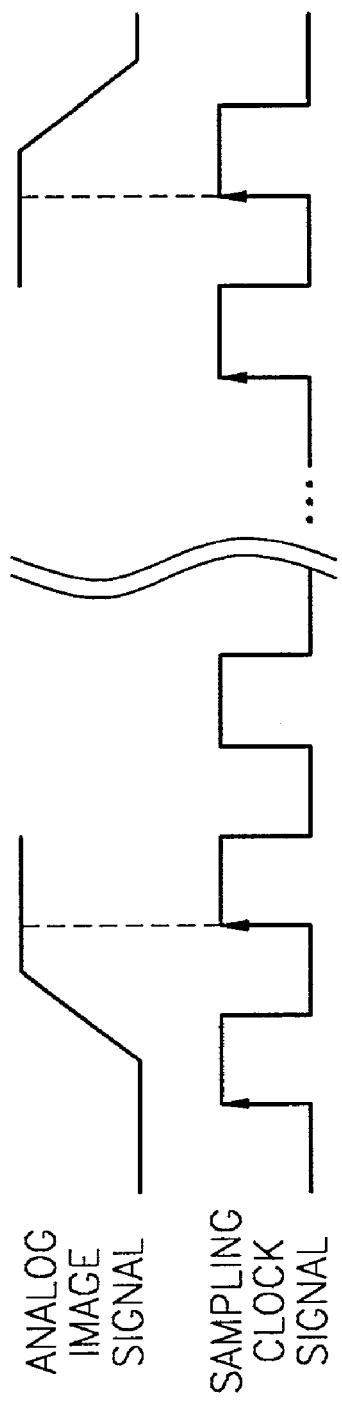
FIGS. 3(a) and 3(b) are timing diagrams for explaining the operation of the apparatus for controlling the phase of a sampling clock signal according to the present invention.

Accordingly, if the active data of the digital image signal output from the ADC 201 has a desired width as shown in FIG. 3(a), the controller 203 recognizes the start of a change in the phase of the sampling clock signal after controlling the phase of the sampling clock signal and stores a total phase delay quantity after the first phase delay quantity is supplied to the PLL circuit 204. Here, the stored total phase delay quantity is a multiple of the first phase delay quantity. For example, if the phase delay of the sampling clock signal is controlled n times by the first phase delay quantity, the stored total phase delay quantity has a value obtained by multiplying the first phase delay quantity by n. The total phase delay quantity may be stored in a memory (not shown), which is internal or external to the controller 203. FIG. 3(a) shows the relationship between the sampling clock signal supplied to the ADC 201 and the analog image signals input if the width of active data of the analog image signal has a desired width.

The controller 203 supplies a predetermined second phase delay quantity to the PLL circuit 204. Here, the second phase delay quantity may be the same as the first phase delay quantity described above, or may be another phase delay quantity. The controller 203 supplies the second phase delay quantity to the PLL circuit 204 and measures the width of active data of a digital image signal output from the ADC 201 by the same method as described above. However, unlike the previously-described measurement method, the controller 203 measures whether or not the width of active data of the digital image signal is greater than a desired width.

Figure 3B:
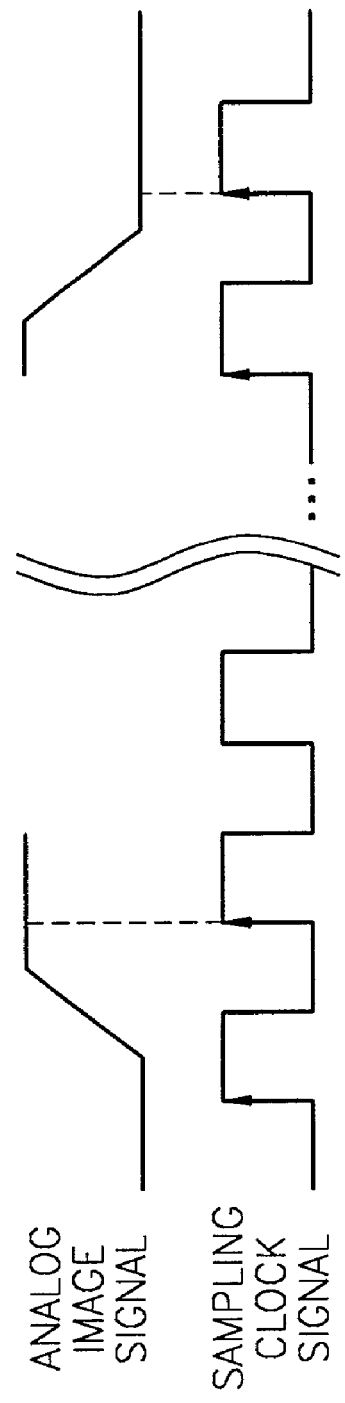

If the measured width of active data is not greater than a desired width, the controller 203 continuously supplies the second phase delay quantity to the PLL circuit 204. However, if the measured width of active data is greater than a desired width, the controller 203 stores a total phase delay quantity after the second phase delay quantity is supplied to the PLL circuit 204. In other words, as shown in FIG. 3(b), the controller 203 determines that the width of active data is not greater than a desired width and controls delay of the sampling clock generated by PLL circuit 204. Once controller 203 determines that the width of active data is greater than a desired width, controller 203 stores the total phase delay quantity. Here, the stored total phase delay quantity is a multiple of the second phase delay quantity. For example, if the phase delay of the sampling clock signal is controlled m times by the second phase delay quantity, the stored total phase delay quantity has a value obtained by multiplying the second phase delay quantity multiplied by m. Also, the measured width of active data is greater than the desired width, which means the phases of the sampling clock signal and the image signal are about to swerve, i.e., this means arrival in the last region in which phases can be controlled. Here, the controller 203 may store the total phase delay quantity in a memory (not shown), which is either internal or external to the controller 203.

The controller 203 detects an average (mean) value of the two stored total phase delay quantities and supplies the average value as an optimum phase delay quantity of the sampling clock signal to the PLL circuit 204.

The PLL circuit 204 outputs a clock signal having a phase which is delayed based on a phase delay quantity supplied from the controller 203 as a sampling clock signal to the ADC 201. Thus, the PLL circuit 204 serves as a clock signal generation circuit.

FIG. 4 is flowchart of a method for controlling the phase of a sampling clock signal in the LCD system according to the present invention.

In step 401, a delay in the phase of a sampling clock signal is controlled by a first phase delay quantity. The width of active data of a current image signal is measured based on a digital image signal output from the ADC 201 in step 402. The width of active data is measured by the method described with respect to controller 203. The width of active data is the width of a horizontal line of the image signal.

In step 403, if the measured width of active data does not have a desired width, steps 401 and 402 are repeated to delay the phase of the sampling clock signal by the first phase delay quantity again and measure the width of active data.

When the measured width of active data has the desired width, a total phase delay quantity delayed after the phase of the sampling clock signal is delayed by the first phase delay quantity is stored as a first total phase delay quantity in step 404.

In step 405, the delay of the phase of the sampling clock signal is controlled by a second phase delay quantity. The width of active data (the width of the first horizontal line) of the current image signal output from the ADC 201 is measured in step 406 by the same method as in step 402. The second phase delay quantity may be the same as the first phase delay quantity, or may be another phase delay quantity.

In step 407, if the measured width of active data is not greater than a desired width, steps 405 and 406 are repeated to delay the phase of the sampling clock signal by the second phase delay quantity again and measure the width of active data.

When the measured width of active data is greater than the desired width, a total phase delay quantity after the phase of the sampling clock signal is delayed by the second phase delay quantity is stored as a second total phase delay quantity in step 408.

In step 409, an optimum delay quantity for the sampling clock signal is detected. In other words, an average value of the first and second total phase delay quantities is detected as the optimum phase delay quantity. The phase of the sampling clock signal is controlled by the detected optimum phase delay quantity in step 410. As a result, a user can always see an image with optimal resolution regardless of changes in conditions of an analog image signal input.

As described above, according to the present invention, the phase of a sampling clock signal is delayed to detect the width of active data (first horizontal width) of an input image signal. An optimum phase delay quantity for the sampling clock signal is detected based on measurement results of the width of active data to control the phase of the sampling clock signal. As a result, it is possible to maintain an optimum image quality regardless of changes in the image signal input.

While this invention has been particularly shown and described with reference to a preferred embodiment thereof, it will be understood by those skilled in the art that various changes in form and details maybe made therein without departing from the spirit and scope of the invention as defined by the appended claims.

What claimed is:

1. An apparatus for controlling a phase of a sampling clock signal used for sampling a received image signal, the apparatus comprising:

a clock signal generation circuit for generating a sampling clock signal which has a phase that is delayed by a supplied phase delay quantity and is used as the sampling clock signal of the image signal; and a controller for controlling a phase delay quantity of the sampling clock signal by a middle value of a first total phase delay quantity supplied until the active data of the received image signal has a desired width after a first phase delay quantity is supplied to the clock signal generation circuit and a second total phase delay quantity supplied until the active data of the received image signal is greater than a desired width after a second phase delay quantity is supplied to the clock signal generation circuit.

2. The apparatus of claim 1, wherein the first total phase delay quantity is a multiple of the first phase delay quantity, and the second total phase delay quantity is a multiple of the second phase delay quantity.

3. The apparatus of claim 1, wherein the width of active data is the width of a horizontal line of the image signal.

4. The apparatus of claim 1, wherein the controller repeatedly supplies the first phase delay quantity to the clock signal generation circuit until the width of active data has the desired width after supplying the first phase delay quantity to the clock signal generation circuit, and repeatedly supplies the second phase delay quantity to the clock signal generation circuit until the width of active data is greater than a desired width after supplying the second phase delay quantity to the clock signal generation circuit.

5. The apparatus of claim 1, wherein the controller measures the desired width using the number of sampling clock signals generated from the desired width.

6. The apparatus of claim 1, wherein the first phase delay quantity and the second delay quantity have the same values.

7. An apparatus for controlling a phase of a sampling clock signal in a liquid crystal display (LCD) system having an analog-to-digital converter (ADC) for converting an analog image signal input to a digital image signal and a graphic processor for scaling the digital image signal output from the ADC to a displayable format, the apparatus comprising:
   a clock signal generation circuit for outputting a sampling clock signal, a phase of which is delayed by a phase delay quantity applied, to the ADC; and
   a controller for controlling a phase delay quantity of the sampling clock signal by a middle value of a first total phase delay quantity supplied until the active data of the image signal output from the ADC has a desired width after a first phase delay quantity is supplied to the clock signal generation circuit and a second total phase delay quantity supplied until the active data of the image signal output from the ADC is greater than a desired width after a second phase delay quantity is supplied to the clock signal generation circuit.

8. A method for controlling the phase of a sampling clock signal for a received image signal, the method comprising:
   measuring whether or not a width of active data of an image signal sampled by a first sampling clock signal, a phase of which is delayed by a first phase delay quantity, has a desired width;
   storing the first phase delay quantity if the width of active data has the desired width;
   measuring whether or not an the width of active data of an image signal sampled by a second sampling clock signal, a phase of which is delayed by a second phase delay quantity, is greater than a desired width;
   storing the second phase delay quantity if the width of active data is greater than the desired width; and
   controlling a phase delay of the sampling clock signal by a middle value of the first phase delay quantity and the second phase delay quantity.

9. The method of claim 8, wherein the phase of the sampling clock signal is continuously delayed by the first phase delay quantity until the width of active data has the desired width in the step of measuring whether or not the width of active data has the desired width, and a phase of the sampling clock signal is continuously delayed by the second phase delay quantity until the width of active data is greater than the desired width in the step of measuring whether or not the width of active data is greater than the desired width.

10. The method of claim 8, wherein the first phase delay quantity in the step of storing the first phase delay quantity is a multiple of the first phase delay quantity in the step of measuring whether or not the width of active data has the desired width, and the second phase delay quantity in the step of storing the second phase delay quantity is a multiple of the second phase delay quantity in the step of measuring whether or not the width of active data is greater than the desired width.

11. The method of claim 8, wherein the desired width is a horizontal line width.

12. The method of claim 8, wherein the first phase delay quantity and the second phase delay quantity have the same values.

13. A method of controlling a phase of a sampling clock signal in a liquid crystal display (LCD) system having an analog-to-digital converter (ADC) for converting an analog image signal input to a digital image signal and a graphic processor for scaling the digital image signal output from the ADC to a displayable format, the method comprising:
   measuring whether or not a width of active data of the digital image signal output from the ADC has a desired width after a first sampling clock signal, a phase of which is delayed by a first phase delay quantity, is supplied to the ADC;
   storing a first total phase delay quantity of the first sampling clock signal if the width of active data has the desired width;
   measuring whether or not the width of active data of the digital image signal output from the ADC is greater than the desired width after a second sampling clock signal, a phase of which is delayed by a second phase delay quantity, is supplied to the ADC;
   storing a second total phase delay quantity of the second sampling clock signal if the width of active data is greater than the desired width; and
   controlling a phase delay of the sampling clock signal supplied to the ADC by a middle value of the first total phase delay quantity and the second total phase delay quantity.

14. A method of controlling a sampling clock in a liquid crystal display system, said method comprising steps of:
   generating a first phase delay quantity and providing said first phase delay quantity to a sampling clock generating circuit;
   generating said sampling clock in response to a clock signal and in further response to said first phase delay quantity;
   converting an analog image signal into a digital image signal in response to said sampling clock;
   measuring a current horizontal line width of active data in said digital image signal;
   determining whether the measured current horizontal line width is equal to a desired width;
   returning to said step of generating said first phase delay quantity until it is determined that the measured horizontal line width is equal to said desired width;
   storing a first total phase delay quantity corresponding to how many times said first phase delay quantity was generated;
   generating a second phase delay quantity and providing said second phase delay quantity to a sampling clock generating circuit;
   generating said sampling clock in response to a clock signal and in further response to said second phase delay quantity;
   converting an analog image signal into a digital image signal in response to said sampling clock;
   measuring the current horizontal line width of active data in said digital image signal;
   determining whether the measured current horizontal line width is greater than a desired width;
   returning to said step of generating said second phase delay quantity until it is determined that the measured horizontal line width is greater than to said desired width;

storing a second total phase delay quantity corresponding to how many times said second phase delay quantity was generated;

calculating an optimum phase delay quantity by summing said first and second phase delay quantities and calculating an average of the sum; and controlling phase delay of said sampling clock in response to said optimum phase delay quantity.

15. A method of controlling a sampling clock in a liquid crystal display system, said sampling clock being generated by a phase lock loop circuit in response to a clock signal and said sampling clock being delayed in response to a phase delay quantity generated by a controller, wherein an analog image signal is converted into a digital image signal in response to said sampling clock, said method comprising steps of:

continuously generating a first phase delay quantity until a current horizontal line width of active data in said digital image signal is equal to a desired width;

storing a first total phase delay quantity corresponding to how many times said first phase delay quantity was generated;

continuously generating a second phase delay quantity until the current horizontal line width of active data in said digital image signal is greater than a desired width;

storing a second total phase delay quantity corresponding to how many times said second phase delay quantity was generated;

calculating an optimum phase delay quantity by summing said first and second phase delay quantities and calculating an average of the sum; and controlling the phase delay of said sampling clock in response to said optimum phase delay quantity.

16. The method as set forth in claim 15, said step of continuously generating a first phase delay quantity until a current horizontal line width of active data in said digital image signal is equal to a desired width comprising steps of:

generating said first phase delay quantity and providing said first phase delay quantity to said phase lock loop circuit;

delaying said sampling clock in response to said first phase delay quantity;

converting said analog image signal into said digital image signal in response to the delayed sampling clock;

measuring the current horizontal line width of active data in said digital image signal;

determining whether the measured current horizontal line width is equal to the desired width; and returning to said step of generating said first phase delay quantity until it is determined that the measured horizontal line width is equal to said desired width.

17. The method as set forth in claim 16, said step of continuously generating a second phase delay quantity until a current horizontal line width of active data in said digital image signal is greater a desired width comprising steps of:

generating said second phase delay quantity and providing said second phase delay quantity to said phase lock loop circuit;

delaying said sampling clock in response to said second phase delay quantity;

converting said analog image signal into said digital image signal in response to the delayed sampling clock;

measuring the current horizontal line width of active data in said digital image signal;

determining whether the measured current horizontal line width is greater than the desired width; and returning to said step of generating said second phase delay quantity until it is determined that the measured horizontal line width is greater than to said desired width.

18. The method as set forth in claim 15, said step of continuously generating a second phase delay quantity until a current horizontal line width of active data in said digital image signal is greater a desired width comprising steps of:

generating said second phase delay quantity and providing said second phase delay quantity to said phase lock loop circuit;

delaying said sampling clock in response to said second phase delay quantity;

converting said analog image signal into said digital image signal in response to the delayed sampling clock;

measuring the current horizontal line width of active data in said digital image signal;

determining whether the measured current horizontal line width is greater than the desired width; and returning to said step of generating said second phase delay quantity until it is determined that the measured horizontal line width is greater than to said desired width.

19. An apparatus for controlling a sampling clock in a liquid crystal display system, said sampling clock being generated by a clock circuit in response to a clock signal and said sampling clock being delayed in response to a phase delay quantity, wherein an analog image signal is converted into a digital image signal by an analog-to-digital converter in response to said sampling clock, said apparatus comprising:

a controller for generating a first phase delay quantity;

a phase lock loop including said clock circuit, said phase lock loop delaying said sampling clock in response to said first delay quantity, said controller continuously generating said first phase delay until a current horizontal line width of active data in said digital image signal is equal to the desired width;

said controller storing a first total phase delay quantity corresponding to how many times said first phase delay quantity was generated;

said controller generating a second phase delay quantity after storing said first total delay quantity;

said phase lock loop delaying said sampling clock in response to said second delay quantity, said controller continuously generating said second phase delay until the current horizontal line width of active data in said digital image signal is greater than the desired width;

said controller storing a second total phase delay quantity corresponding to how many times said second phase delay quantity was generated;

said controller calculating an optimum phase delay quantity by summing said first and second phase delay quantities and determining an average of the sum; and said phase lock loop delaying said sampling clock in response to said optimum phase delay quantity.

20. The apparatus as set forth in claim 19, wherein said controller generates said first and second phase delay quantities in response to a screen adjustment signal.

21. The apparatus as set forth in claim 19, wherein said controller generates said first and second phase delay quantities in response to a recognized need for internal adjustment of a screen during operational control of said liquid crystal display system.

* * * * *